US008432211B2

(12) United States Patent
Choksi et al.

(10) Patent No.: US 8,432,211 B2
(45) Date of Patent: Apr. 30, 2013

(54) MIXER-TRANSCONDUCTANCE INTERFACE

(75) Inventors: Ojas M. Choksi, San Diego, CA (US); Mahim Ranjan, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 12/763,458

(22) Filed: Apr. 20, 2010

(65) Prior Publication Data
US 2011/0001539 A1 Jan. 6, 2011

Related U.S. Application Data

(60) Provisional application No. 61/222,569, filed on Jul. 2, 2009.

(51) Int. Cl.
*G06G 7/12* (2006.01)
(52) U.S. Cl.
USPC .......................................... 327/355; 455/323
(58) Field of Classification Search .......... 327/355–361; 455/326, 333, 323
See application file for complete search history.

(56) References Cited

U.S. PATENT DOCUMENTS

| | | | |
|---|---|---|---|
| 6,590,438 B1 * | 7/2003 | Manku et al. | 327/359 |
| 6,917,788 B2 * | 7/2005 | Malhi et al. | 455/76 |
| 7,005,628 B2 * | 2/2006 | Rossi | 250/214 A |
| 7,162,029 B2 * | 1/2007 | Soman et al. | 379/399.02 |
| 7,164,897 B2 * | 1/2007 | Manku et al. | 455/293 |
| 7,266,357 B2 * | 9/2007 | Behzad | 455/285 |
| 7,392,026 B2 * | 6/2008 | Alam et al. | 455/180.1 |
| 7,457,606 B2 | 11/2008 | Kim | |
| 7,477,888 B2 * | 1/2009 | Behzad | 455/323 |
| 2004/0213278 A1 | 10/2004 | Pullen et al. | |
| 2005/0165949 A1 | 7/2005 | Teague | |
| 2006/0218302 A1 | 9/2006 | Chia et al. | |
| 2006/0220743 A1 | 10/2006 | Kojima | |
| 2008/0075184 A1 | 3/2008 | Muharemovic et al. | |
| 2009/0245421 A1 | 10/2009 | Montojo et al. | |
| 2010/0182911 A1 | 7/2010 | Pullen et al. | |
| 2011/0145584 A1 | 6/2011 | Coburn et al. | |

FOREIGN PATENT DOCUMENTS

| | | |
|---|---|---|
| JP | 2008091994 | 4/2008 |
| WO | WO9726710 | 7/1997 |
| WO | WO03071696 | 8/2003 |

OTHER PUBLICATIONS

International Search Report—PCT/US2010/040960—International Search Authority, European Patent Office, Nov. 19, 2010.
International Search Report and Written Opinion—PCT/US2010/040958, International Search Authority—European Patent Office—Nov. 19, 2010.
M Miyoshi et al., "Performance Improvement of TCP in wireless cellular network based acknowledgement control", Department of Infomatics and Mathematical Secience, Gradute School of Engineering Science, Osaka University, Japan, Proceedings of the 7th Asia Pacific, pp. 1-15, 2001.
Miller et al., "Cumulative acknowledgement multicast repetition policy for wirless LANs or ad hoc network clusters" IEEE,Wireless Communication Technologies Group National Institute of Standards and Technology, Maryland Gaithersburg, pp. 3403-3407, 2002.

* cited by examiner

*Primary Examiner* — Dinh T. Le
(74) *Attorney, Agent, or Firm* — S. Hossain Beladi

(57) ABSTRACT

Techniques for providing an efficient interface between a mixer block and a transconductance (Gm) block. In an exemplary embodiment, the output currents of at least two unit cells of the transconductance block are conductively coupled together, and coupled to the mixer block using a single conductive path. For a differential signal, the conductive path may include two conductive leads. Within the mixer block, the single conductive path may be fanned out to at least two unit cells of the mixer block. At least one Gm unit cell may be selectively enabled or disabled to control the gain setting of the mixer-transconductance block. The techniques may further be applied to transceiver architectures supporting in-phase and quadrature mixing, as well as multi-mode and/or multi-band operation.

29 Claims, 10 Drawing Sheets

MIXER-TRANSCONDUCTANCE INTERFACE

CLAIM OF PRIORITY UNDER 35 U.S.C. §120

The present application for patent claims priority to U.S. Provisional Patent Application Ser. No. 61/222,569, filed Jul. 2, 2009, entitled, "Efficient Mixer-Transconductance Interface," currently pending, and assigned to the assignee hereof and hereby expressly incorporated by reference herein.

BACKGROUND

1. Field

The disclosure relates to circuit design, and in particular, to an efficient mixer-transconductance interface.

2. Background

Communications circuitry may employ one or more mixer circuits to translate a signal spectrum from one frequency to another frequency. For example, in a transmitter, a mixer may be used in an upconverter to convert a baseband signal to a radio-frequency (RF) signal. In a receiver, a mixer may be used in a downconverter to convert a received RF signal to an intermediate frequency (IF) or baseband for processing. Certain mixer circuits may utilize a current-mode architecture wherein a first input voltage is mixed with a signal current, e.g., a bias current of the mixer, to generate an output signal. The signal current may be generated by a transconductance (Gm) block, which in turn generates the signal current from a second input voltage. In some implementations, both the mixer and the Gm block may be provided with multiple gain settings to tune the overall gain of the mixer-transconductance block.

In multi-band or multi-mode transceivers, multiple instances of the mixer and/or Gm block may be provided to accommodate operation in each separate signal path or mode. This may require certain portions of the mixer-transconductance block to be replicated to support the multiple modes of operation. Furthermore, the mixer may be required to process complex signals, i.e., signals having both an in-phase (I) and quadrature (Q) component. The amount of added circuitry required to support multi-mode and complex operation may unacceptably increase the integrated circuit (IC) die area, as well as increase the number of signal leads in the interface between the mixer and the Gm block.

It would be desirable to provide an efficient architecture for a mixer and a Gm block that provides multiple gain settings for the mixer-transconductance block, and which further efficiently accommodates mixing of complex signals for multi-mode operation.

SUMMARY

An aspect of the present disclosure provides an apparatus comprising: a mixer block coupled to a first input voltage, the mixer block comprising a plurality of mixer unit cells each coupled to the first input voltage and to a corresponding mixer unit input current, at least one mixer unit cell capable of being selectively enabled or disabled, each mixer unit cell configured to generate an output signal proportional to the first input voltage mixed with the corresponding mixer unit input current; a transconductance (Gm) block coupled to a second input voltage, the Gm block comprising a plurality of Gm unit cells each coupled to the second input voltage, at least one Gm unit cell capable of being selectively enabled or disabled, each Gm unit cell configured to generate at least one Gm unit output current proportional to the second input voltage, the Gm unit output currents of the plurality of Gm unit cells conductively coupled together; and a conductive path coupling the conductively coupled Gm unit output currents to the mixer unit input currents.

Another aspect of the present disclosure provides a method comprising: coupling a first input voltage to a plurality of mixer unit cells within a mixer block; selectively enabling or disabling at least one mixer unit cell; coupling a second input voltage to a plurality of transconductance (Gm) unit cells within a Gm block; selectively enabling or disabling at least one Gm unit cell; and coupling the output currents of at least two Gm unit cells to the mixer block using a single conductive path.

Yet another aspect of the present disclosure provides an apparatus comprising: a mixer block coupled to a first input voltage, the mixer block comprising a plurality of mixer unit cells each coupled to the first input voltage and to a corresponding mixer unit input current, at least one mixer unit cell capable of being selectively enabled or disabled, each mixer unit cell configured to generate an output signal proportional to the first input voltage mixed with the corresponding mixer unit input current; a transconductance (Gm) block coupled to a second input voltage, the Gm block comprising a plurality of Gm unit cells each coupled to the second input voltage, at least one Gm unit cell capable of being selectively enabled or disabled, each Gm unit cell configured to generate at least one Gm unit output current proportional to the second input voltage; and means for efficiently coupling the Gm unit output currents to the mixer unit input currents.

Yet another aspect of the present disclosure provides a device for wireless communications, the device comprising at least one baseband transmit (TX) amplifier for amplifying a TX signal, a TX LO signal generator, an upconverter coupled to the TX LO signal generator and the output of the at least one baseband TX amplifier, a TX filter coupled to the output of the upconverter, a power amplifier (PA) coupled to the TX filter, an RX filter, a low-noise amplifier (LNA) coupled to the RX filter, an RX LO signal generator, a downconverter coupled to the RX LO signal generator and the RX filter, at least one low-pass filter coupled to the output of the downconverter, at least one of the upconverter and the downconverter comprising: a mixer block coupled to a first input voltage, the mixer block comprising a plurality of mixer unit cells each coupled to the first input voltage and to a corresponding mixer unit input current, at least one mixer unit cell capable of being selectively enabled or disabled, each mixer unit cell configured to generate an output signal proportional to the first input voltage mixed with the corresponding mixer unit input current; a transconductance (Gm) block coupled to a second input voltage, the Gm block comprising a plurality of Gm unit cells each coupled to the second input voltage, at least one Gm unit cell capable of being selectively enabled or disabled, each Gm unit cell configured to generate at least one Gm unit output current proportional to the second input voltage, the Gm unit output currents of the plurality of Gm unit cells conductively coupled together; and a conductive path coupling the conductively coupled Gm unit output currents to the mixer unit input currents.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
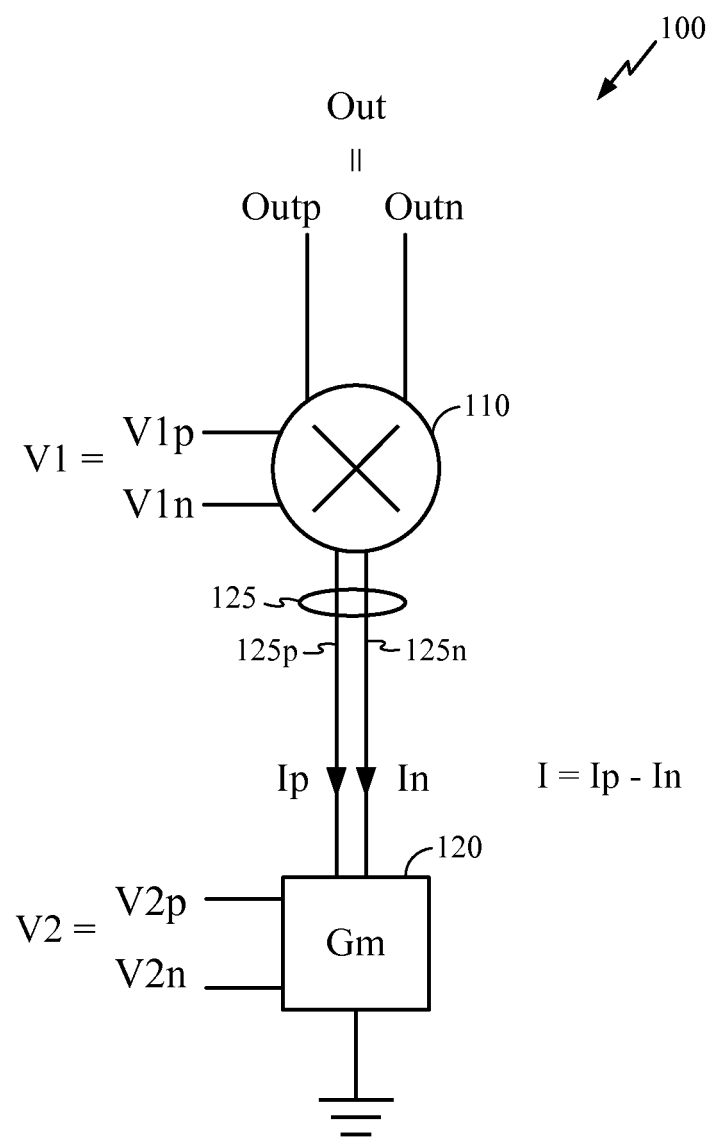
FIG. 1 illustrates an instance of a prior art mixer coupled to a transconductance (Gm) block.

FIG. 1 illustrates the operation of a prior art mixer-transconductance block 100. In FIG. 1, a mixer block 110 is configured to mix or multiply a first differential input voltage V1=V1p−V1n with a mixer differential input current I=Ip−In to generate a differential output signal Out=Outp−Outn, which may be a differential voltage or a differential current. The differential current I is generated by a Gm block 120, which is designed to cause I to be linearly proportional to a second differential input voltage V2=V2p−V2n over a suitable range. It will be appreciated that the overall mixer-transconductance block 100 effectively mixes the first differential input voltage V1 with the second differential input voltage V2 to generate the differential output signal Out, with the magnitude of Out relative to V1 and V2 characterized by the gains of the mixer block 110 and the Gm block 120. In the example shown, the differential current I is supplied to the mixer block 110 over a conductive path 125, which may be defined to include two conductive leads 125p and 125n for the currents Ip and In, respectively.

While the first and second input voltages V1 and V2 are shown as differential voltages in FIG. 1, it will be appreciated that the techniques of the present disclosure need not be limited to mixer blocks or Gm blocks processing differential voltages. Single-ended voltages may also be readily accommodated, and modifications to the techniques shown may readily be derived by one of ordinary skill in the art. Furthermore, it will be appreciated that the mixer can be single-balanced or double-balanced. Such alternative exemplary embodiments are contemplated to be within the scope of the present disclosure.

In an exemplary embodiment, the mixer block 110 and Gm block 120 may be utilized in, e.g., an upconverter for an RF transmitter application. In this case, the voltage V1 may be, e.g., a transmit (TX) local oscillator (LO) voltage, and the voltage V2 may be, e.g., a baseband TX signal to be transmitted. Alternatively, the mixer block 110 and Gm block 120 may be utilized in, e.g., a downconverter for an RF receiver application. In this case, the voltage V1 may be, e.g., a receive (RX) LO voltage, and the voltage V2 may be, e.g., a received RF signal to be downconverted to baseband or some other intermediate frequency (IF). Further description of the application of the techniques of the present disclosure to a radio transceiver architecture is given with reference to FIG. 6 hereinbelow.

Figure 1A:
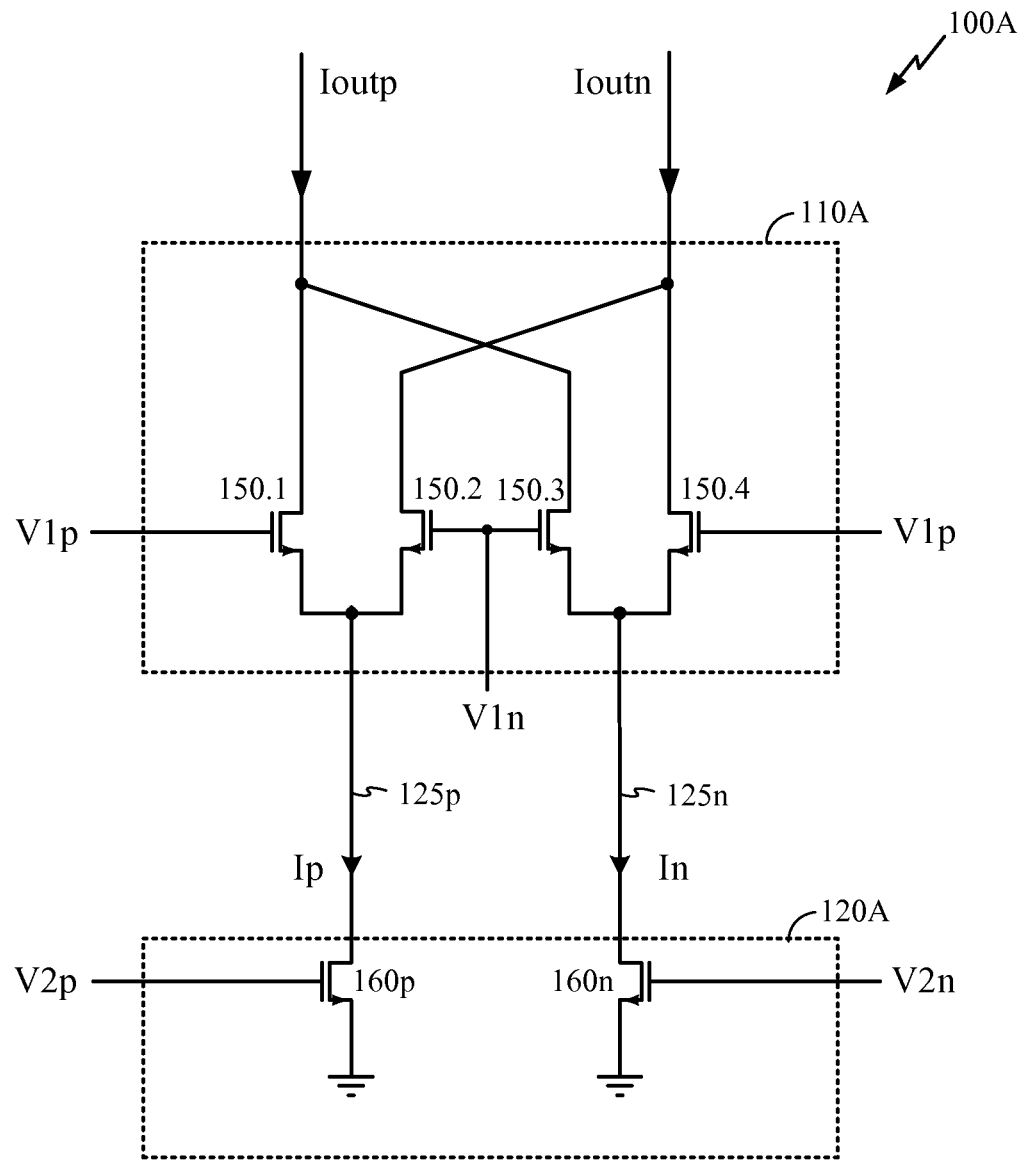
FIG. 1A illustrates an example implementation of a prior art active double-balanced current-mode differential mixer-transconductance architecture for the block shown in FIG. 1.

FIG. 1A illustrates an example implementation 100A of a prior art active double-balanced current-mode differential mixer-transconductance architecture for the block 100 shown in FIG. 1. Note FIG. 1A is shown for illustrative purposes only, and is not meant to limit the scope of the present disclosure to any particular techniques for implementing mixers or Gm blocks. For example, one of ordinary skill in the art will appreciate that passive mixer implementations may also adopt the techniques of the present disclosure, and such alternative exemplary embodiments are contemplated to be within the scope of the present disclosure.

In FIG. 1A, a Gm block 120A includes transistors 160p and 160n configured to convert the voltages V2p and V2n into currents Ip and In, respectively. The current Ip is provided via a conductive lead 125p to a first mixer differential pair including transistors 150.1 and 150.2, while the current In is provided via a conductive lead 125n to a second mixer differential pair including transistors 150.3 and 150.4. The first and second mixer differential pairs collectively form the mixer block 110A, and multiply the input voltages V1p and V1n with the currents Ip and In generated by the Gm block 120A. The outputs of the first and second mixer differential pairs are cross-coupled to generate a differential output current Iout=Ioutp−Ioutn.

Figure 2:
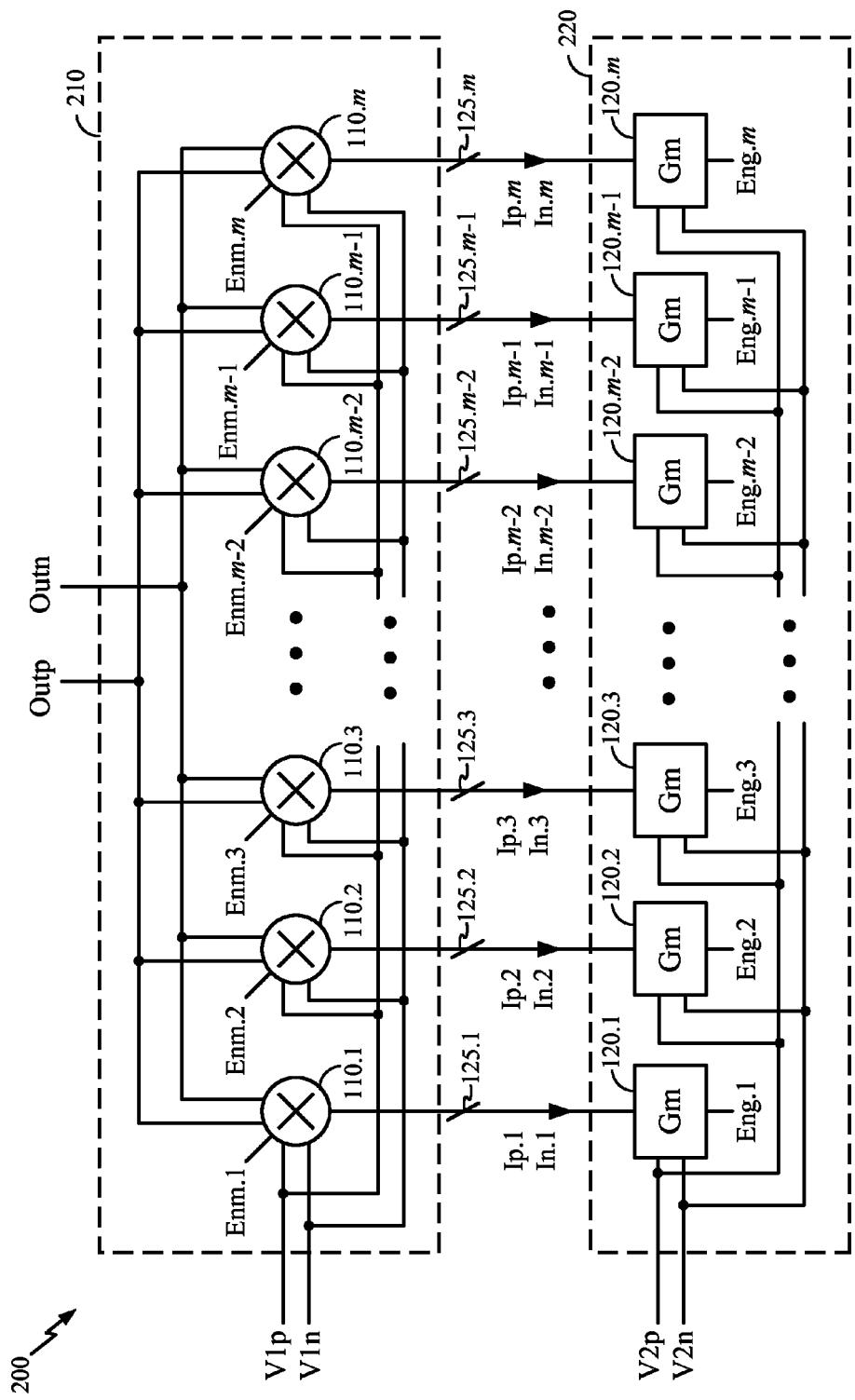
FIG. 2 illustrates an example prior art implementation of a mixer coupled to a Gm block with gain control.

FIG. 2 illustrates an example prior art implementation of a mixer block 210 coupled to a Gm block 220 with gain control, collectively referred to herein as the gain-controlled mixer-transconductance block 200. The mixer block 210 includes a set of m mixer unit cells 110.1 through 110.m, and the Gm block 220 includes a set of m Gm unit cells 120.1 through 120.m in one-to-one correspondence with the m mixer unit cells. The first differential input voltage V1=V1p−V1n is provided to each of the mixer unit cells 110.1 through 110.m, and the second differential input voltage V2=V2p−V2n is provided to each of the Gm unit cells 120.1 through 120.m. The Gm unit cells generate corresponding Gm unit differential output currents Ip.1 and In.1 through Ip.m and In.m, coupled to corresponding ones of the mixer unit cells via the conductive paths 125.1 through 125.m. Each of the conductive paths 125.1 through 125.m may include two conductive leads: one to carry a positive current Ip.k, and one to carry a negative current In.k, wherein k is an index from 1 to m. In an implementation, each of the mixer unit cells 110.1 through 110.m may incorporate the circuitry of 110A as shown in FIG. 1A, and each of the mixer unit cells 120.1 through 120.m may incorporate the circuitry of 120A also as shown in FIG. 1A.

In FIG. 2, gain control of the mixer-transconductance block 200 may be accomplished as follows. Each of the m mixer unit cells 110.1 through 110.m may be enabled or disabled by corresponding enable signals (or control bits)

Enm.1 through Enm.m, while each of the m Gm unit cells 120.1 through 120.m may also be enabled or disabled by corresponding enable signals Eng.1 through Eng.m. By selecting which of the mixer-Gm unit cell pairs are enabled or disabled at any time, the total current mixed with the input voltage V1 may be selected, thus allowing gain control of the mixer-transconductance block 200 using a plurality of gain steps. For example, for maximum gain, all of the Gm unit cells 120.1 through 120.m may be enabled to generate maximum current from the Gm block 220, and all of the corresponding mixer unit cells 110.1 through 110.m may also be enabled. Alternatively, a subset of the Gm unit cells 120.1 through 120.m may be enabled, along with a corresponding subset of the mixer unit cells 110.1 through 110.m, to generate a gain less than the maximum gain.

In an exemplary embodiment, the gain of the mixer-transconductance block 200 may be controlled according to a digital scheme such as a binary coding scheme, thermometer coding scheme, or any other coding scheme known in the art. For example, in a binary coding implementation of the mixer-transconductance block 200 with a 4-bit gain control, 5 mixer-Gm unit cell pairs sized 1×, 1×, 2×, 4×, and 8× may be provided. In such a binary coding implementation, sixteen non-zero gain levels may be specified by selectively enabling or disabling the mixer-Gm unit cell pairs using the four control bits, with one of the 1×-sized mixer-Gm unit cells always enabled. Alternatively, in a thermometer coding implementation, 16 mixer-Gm unit cell pairs, each sized 1×, may be provided. In this thermometer coding implementation, sixteen non-zero gain levels may be specified by selectively enabling or disabling the mixer-Gm unit cell pairs using four control bits and a decoder. The decoder may function to translate the four control bits into individual enable/disable signals for the 16 mixer-Gm unit cell pairs.

As previously mentioned, while drawn as single lines in FIG. 2 for simplicity, to accommodate differential signals, each of the conductive paths 125.1 through 125.m may in fact be composed of two separate conductive leads, one for the positive current Ip and one for the negative current In. In this case, the binary coding implementation just described may require 5 conductive paths or 10 conductive leads to implement sixteen non-zero gain levels, while the thermometer coding implementation may require 16 conductive paths or 32 conductive leads. For implementations supporting multiple distinct frequency ranges, the number of required conductive leads may be correspondingly multiplied. For example, if a mixer-transconductance block supports three separate frequency ranges (e.g., low, middle, high), then 15=3×5 conductive paths would be required for the binary coding implementation, and 48=3×16 conductive paths would be required for the thermometer coding implementation.

Furthermore, certain transceivers may be designed to accommodate quadrature mixing schemes, i.e., first in-phase and quadrature input voltages may be mixed with second in-phase and quadrature input voltages. In that case, each unit gain cell may further be associated with two conductive paths, which would require a total of 30=2×15 conductive paths (or 60 conductive leads when the signal is differential) for the binary coding implementation, and 96=2×48 conductive paths (or 192 conductive leads when the signal is differential) for the thermometer coding implementation.

It will be appreciated that routing such a large number of conductive leads in an IC may consume significant die area and increase the die cost. Furthermore, various parasitic elements may be associated with the conductive leads, including the resistance of the conductive leads, their capacitance to ground, and also their capacitance with respect to each other via sidewall capacitance. These parasitic elements may negatively impact the linearity of the Gm block, increase mixer noise, and degrade residual side-band rejection (RSB) of the mixer circuit. It would thus be desirable to minimize the number of conductive leads in the interface between the mixer block and the Gm block.

Figure 3:
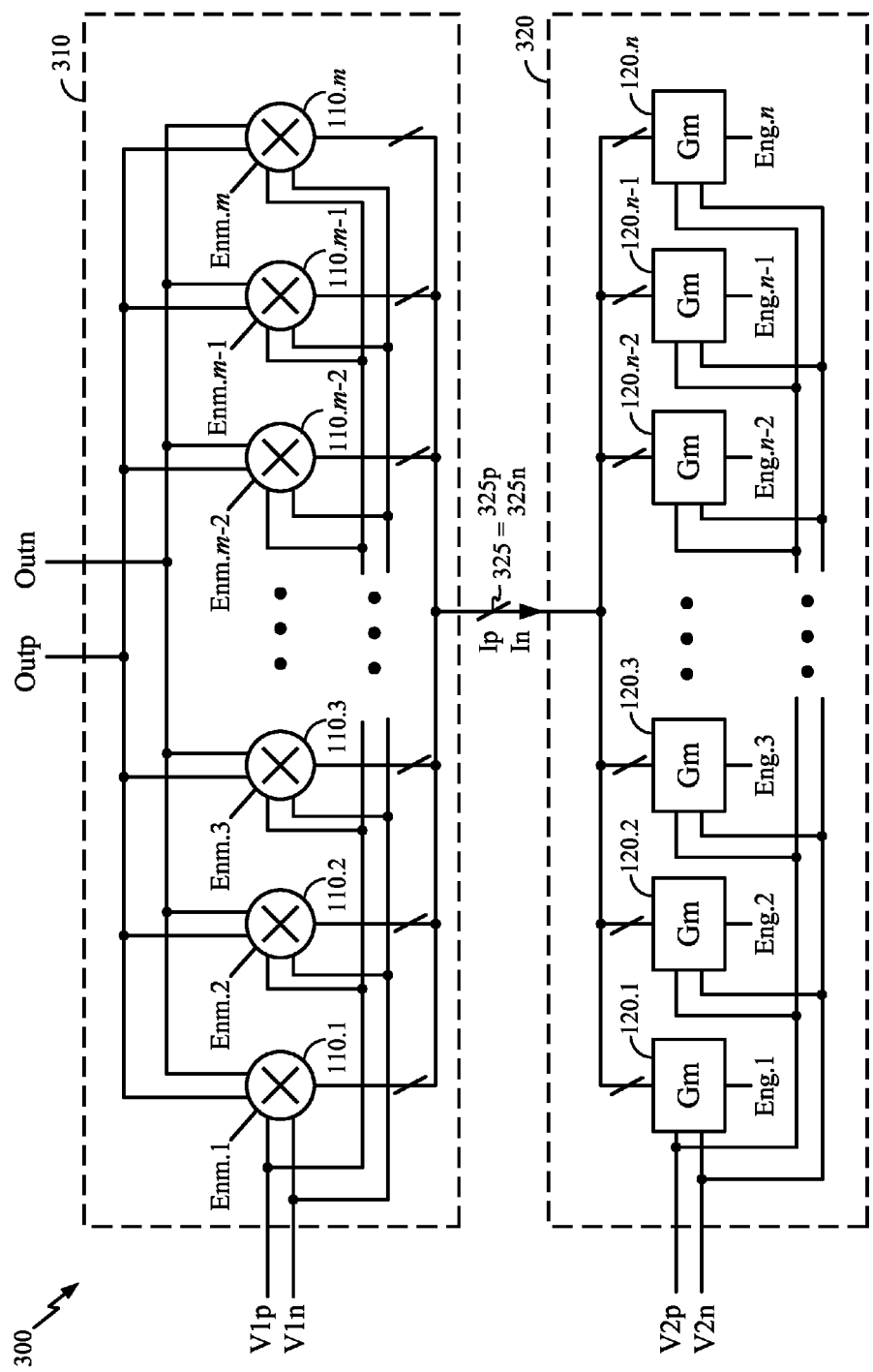
FIG. 3 illustrates an exemplary embodiment of a gain-controlled mixer-transconductance architecture according to the present disclosure.

FIG. 3 illustrates an exemplary embodiment 300 of a gain-controlled mixer-transconductance block according to the present disclosure. In FIG. 3, the Ip outputs of the n Gm unit cells 120.1 through 120.n are conductively coupled together, and the In outputs of the n Gm unit cells are also conductively coupled together. In this specification and in the claims, the term "conductively coupled" shall denote the condition wherein an electrical short circuit, i.e., a conductive path of low electrical resistance, exists between the coupled nodes.

The sum of the Ip currents is carried on a single conductive lead 325p, and the sum of the In currents is carried on a single conductive lead 325n. The two conductive leads 325p and 325n are collectively labeled as the conductive path 325 in FIG. 3. At the mixer, the leads 325p and 325n are each coupled to the individual current inputs of the mixer unit cells 110.1 through 110.m. The conductive leads 325p and 325n may be understood as being fanned out to each of the mixer unit cells. To adjust the gain of the mixer-transconductance block 300, the individual unit cells of the Gm block 320 may be selectively enabled or disabled. In particular, each of the n Gm unit cells 120.1 through 120.n may be enabled or disabled by a corresponding signal Eng.1 through Eng.n.

In addition to selective enablement of the Gm unit cells 120.1 through 120.n, the m mixer unit cells 110.1 through 110.m may also be selectively enabled by corresponding signals Enm.1 through Enm.m. It will be appreciated that selectively enabling the mixer unit cells, while not necessarily affecting the overall gain of the mixer-transconductance block 300, will affect the linearity of the mixer unit cells, as well as the headroom (e.g., drain-to-source voltage) available to the Gm unit cells during operation. For example, when the Gm unit cells are programmed to generate a minimum value for the currents Ip and In, then fewer mixer unit cells may be enabled. Conversely, when the Gm unit cells are programmed to generate a maximum value of the currents Ip and In, then more mixer unit cells may be enabled to effectively accommodate the larger current from the Gm unit cells.

Note that while each of the mixer unit cells 110.1 through 110.m is shown as being coupled to a corresponding selective enable signal Enm.1 through Enm.m, in general, not all mixer unit cells need to be coupled to a corresponding selective enable signal. For example, in an exemplary embodiment, the first mixer unit cell 110.1, or any other number of mixer unit cells, may be always enabled. Such alternative exemplary embodiments are contemplated to be within the scope of the present disclosure.

It will be appreciated that the number of conductive leads in the block 300 is advantageously reduced as compared to the number of such leads in the mixer-transconductance block 200 shown in FIG. 2, while the feature of adjustable gain for the mixer-transconductance block is retained.

It will further be appreciated that as the outputs of the Gm unit cells are conductively coupled together and provided to the mixer unit cells as conductive leads 325p and 325n, the number of Gm unit cells and mixer unit cells need not be the same, and each Gm unit cell need not have a one-to-one correspondence with a corresponding mixer unit cell. For example, the number n of Gm unit cells 120.1 through 120.n is shown in FIG. 3 as being different from the number m of mixer unit cells 110.1 through 110.m. Furthermore, the selection of which Gm unit cells to enable or disable may be made independently of the corresponding selection of mixer unit cells. This feature provides an additional degree of freedom in programming the characteristics of the mixer-transconductance block 300.

Figure 3A:
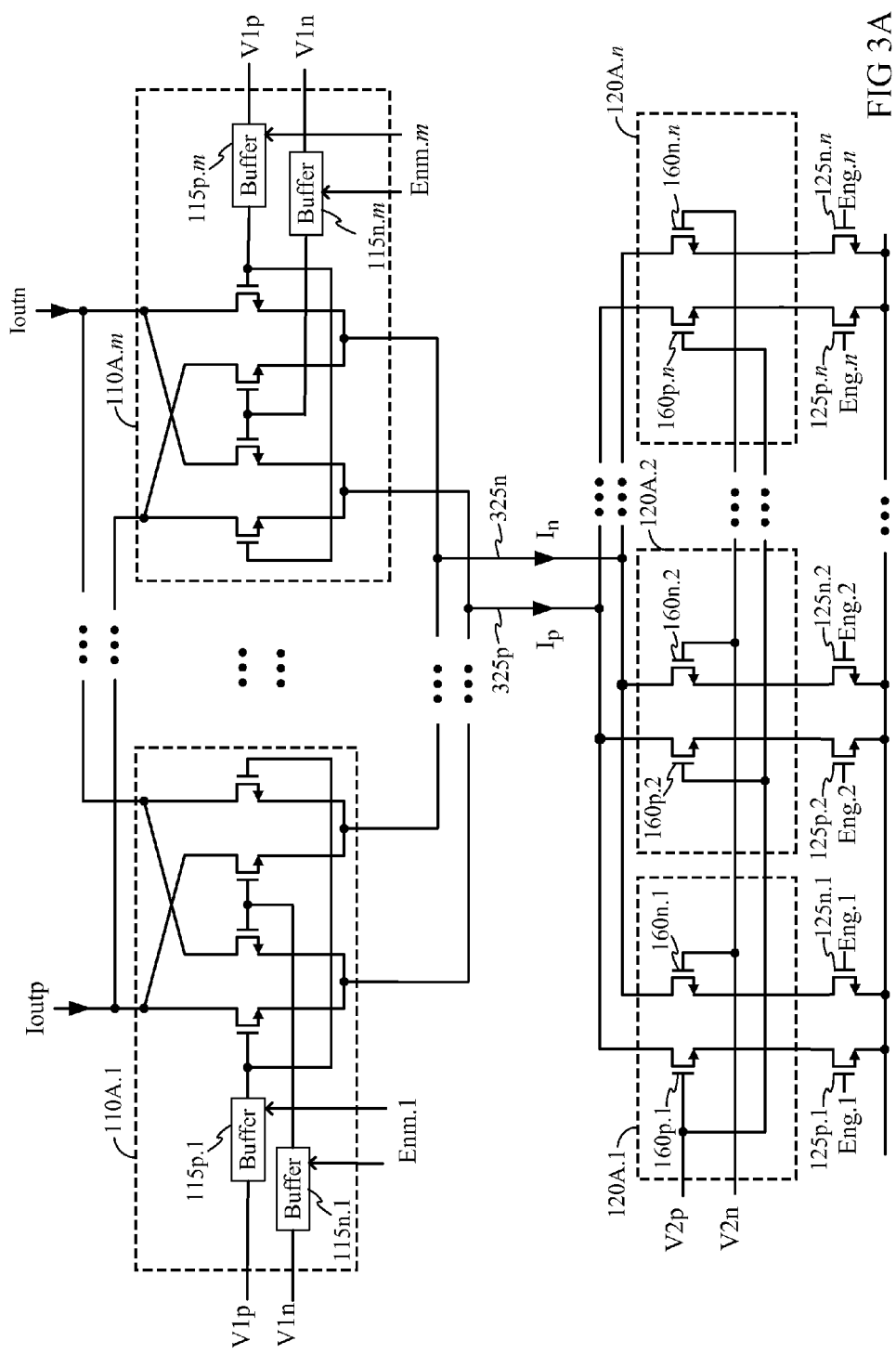
FIG. 3A illustrates an exemplary transistor-level embodiment of the mixer-transconductance block shown in FIG. 3.

FIG. 3A illustrates an exemplary transistor-level embodiment of the mixer-transconductance block shown in FIG. 3. Note that FIG. 3A is provided for illustrative purposes only, and is not meant to limit the scope of the present disclosure to any particular transistor-level implementations of the blocks described.

In FIG. 3A, each Gm unit cell 120A.1 through 120A.n is shown implemented using the differential pair architecture of Gm block 120A in FIG. 1A. Corresponding switch transistors 125p.1, 125n.1 through 125p.n, 125n.n are provided for the Gm unit cells 120A.1 through 120A.n. The switch transistors are coupled to the corresponding enable signals Eng.1 through Eng.n, and are configured to selectively enable or disable the corresponding Gm unit cell.

As previously described herein with reference to FIG. 3, the Ip outputs of the n Gm unit cells 120.1 through 120.n are conductively coupled together in FIG. 3A, and the In outputs of the n Gm unit cells are also conductively coupled together. The positive current Ip is routed to the mixer blocks 110A.1 through 110A.m using a single conductive lead 325p, while the negative current Ip is also routed to the mixer blocks using a single conductive lead 325n.

Each of the mixer unit cells 110A.1 through 110A.m adopts the double-balanced mixer architecture of the mixer block 110A shown in FIG. 1A. In the exemplary embodiment shown, selective enable buffers 115p, 115n (individually denoted in FIG. 3A for each mixer unit cell as 115p.1 through 115p.m and 115n.1 through 115n.m) are provided in each of the mixer unit cells 110A.1 through 110A.m. The selective enable buffers 115p, 115n may, in response to the corresponding enable signal Enm.1 through Enm.m, pass through or reject the corresponding input voltages to the first and second mixer differential pairs in each mixer unit cell, thereby effectively turning on or off the mixer unit cell.

Figure 3B:
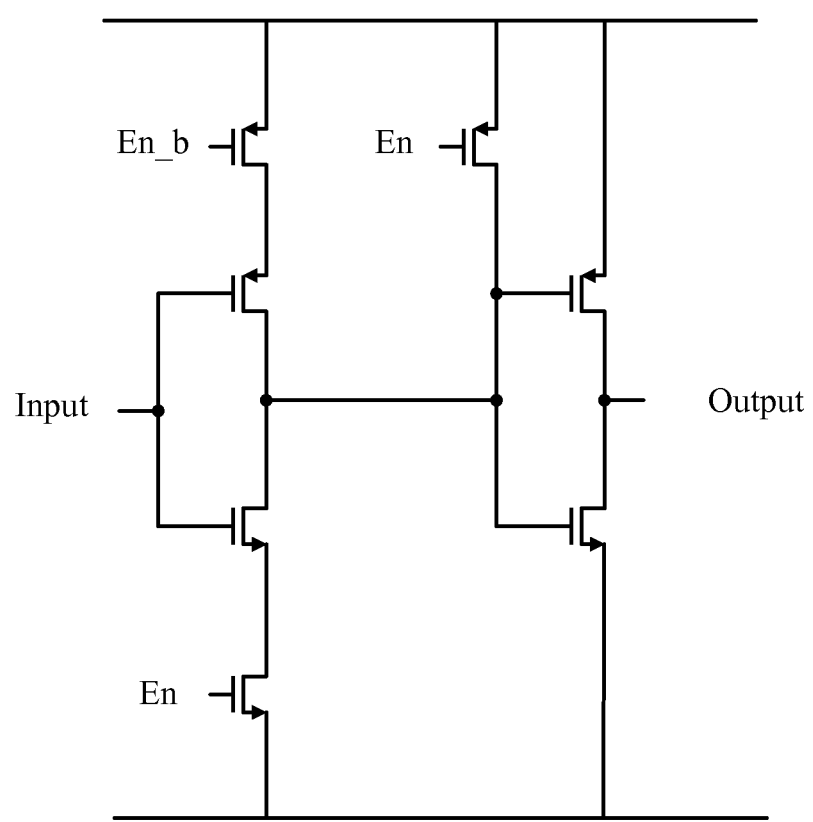
FIG. 3B illustrates an exemplary embodiment of the buffer block shown in FIG. 3A.

FIG. 3B illustrates an exemplary embodiment of a buffer block 115p or 115n shown in FIG. 3A, wherein Input denotes an input voltage to the buffer, Output denotes the output voltage of the buffer, and En and En_b denote the selective enable signal and the logical inverse of the selective enable signal, respectively.

It will be appreciated that the specific implementations of the selective enable feature for the mixer block and Gm block shown in FIGS. 3A and 3B are provided for illustrative purposes only, and are not meant to limit the scope of the present disclosure. Other implementations of the selective enable feature may be readily derived by one of ordinary skill in the art, and such alternative exemplary embodiments are contemplated to be within the scope of the present disclosure.

It may be appreciated that any or all of the transistors 160p.1 through 160p.n (or "Gm transistors") may share a common drain, while any or all of the transistors 160n.1 through 160n.n (also denoted "Gm transistors") may also share a common drain. For example, in FIG. 3A, transistors 160p.1 through 160p.n share a common drain, while transistors 160n.1 through 160n.n also share a common drain. It will be appreciated that the sharing of a common drain by transistors of more than one Gm unit cell may advantageously reduce the die area required to implement a mixer-transconductance block according to the present disclosure.

Figure 4:
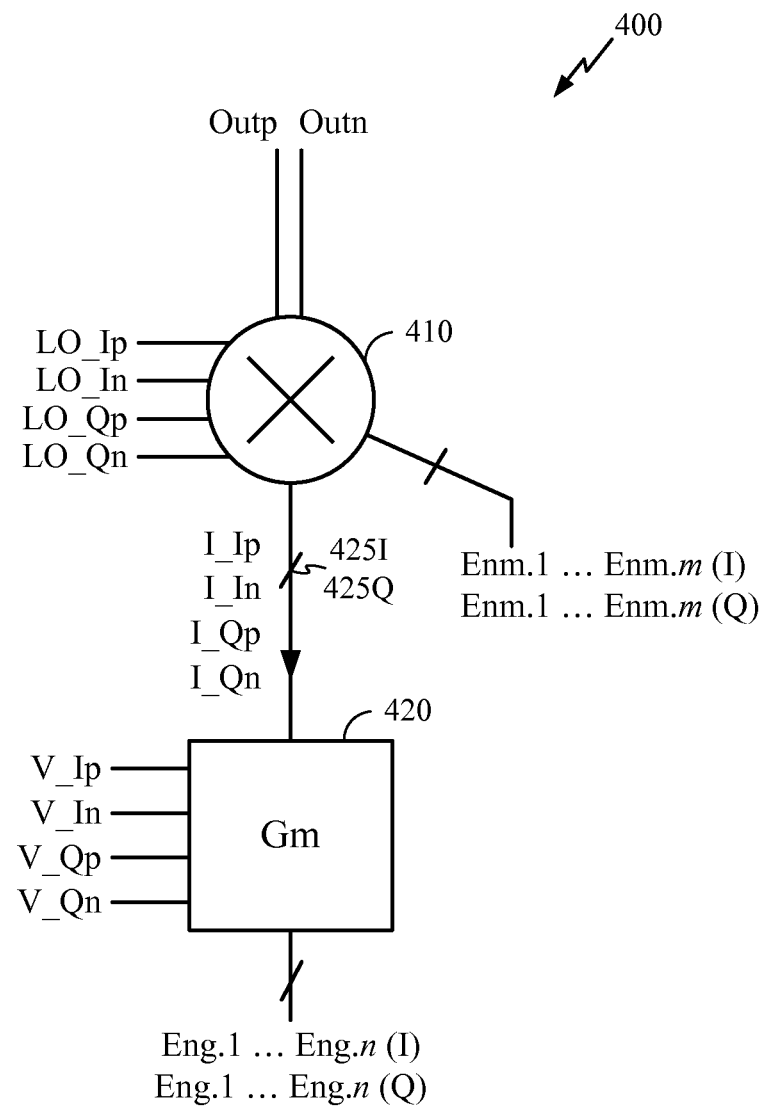
FIG. 4 illustrates an exemplary embodiment of a mixer-transconductance architecture for mixing two complex signals with each other.

In an exemplary embodiment, the techniques described herein may further accommodate transceivers utilizing a quadrature mixing scheme. FIG. 4 illustrates an exemplary embodiment 400 of a mixer-transconductance block for mixing two complex signals with each other. In FIG. 4, the mixer-transconductance block 400 is configured to mix in-phase and quadrature differential local oscillator voltages (LO_Ip, LO_In, LO_Qp, LO_Qn) with in-phase and quadrature differential voltages (V_Ip, V_In, V_Qp, V_Qn) corresponding to a received signal or signal to be transmitted. Note in FIG. 4 that the enable signals for the mixer unit cells (not shown) are labeled Enm.1 . . . . Enm.m (I) for the in-phase voltages and Enm.1 . . . Enm.m (Q) for the quadrature voltages, while enable signals for the Gm unit cells (also not shown) are labeled Eng.1 . . . Eng.n (I) for the in-phase voltages and Eng.1 . . . Eng.n (Q) for the quadrature voltages.

In the embodiment 400, separate conducting paths are provided to couple each of the I and Q currents generated at the output of the Gm block 420 to the mixer block 410, leading to two conducting paths 425I and 425Q, or four conducting leads total for the differential signals. In an exemplary embodiment, it will be appreciated that the total number of conductive leads between a Gm block and a mixer is generally equal to the number of voltage inputs to the Gm block. Thus, in the case where there are four voltage inputs V_Ip, V_In, V_Qp, V_Qn as shown in FIG. 4, there are four conductive leads for conducting I_Ip, I_In, I_Qp, I_Qn.

In alternative exemplary embodiments, e.g., the number of leads may be greater or less depending on the number of voltage inputs to the Gm block. For example, if there is only one single-ended voltage input V provided to a Gm block (composed of a plurality of Gm unit cells), then only one conductive lead between the Gm block and the mixer block may be provided according to the present disclosure.

It will be appreciated that the architecture shown in FIG. 4 need not be applied to the mixing of complex signals that have in-phase (I) and quadrature (Q) quadrature components. In alternative exemplary embodiments, the architecture shown in FIG. 4 may also be applied to the mixing of any multi-dimensional signals, e.g., two-dimensional signals each having a primary component and an auxiliary component. Such alternative exemplary embodiments are contemplated to be within the scope of the present disclosure.

Figure 5:
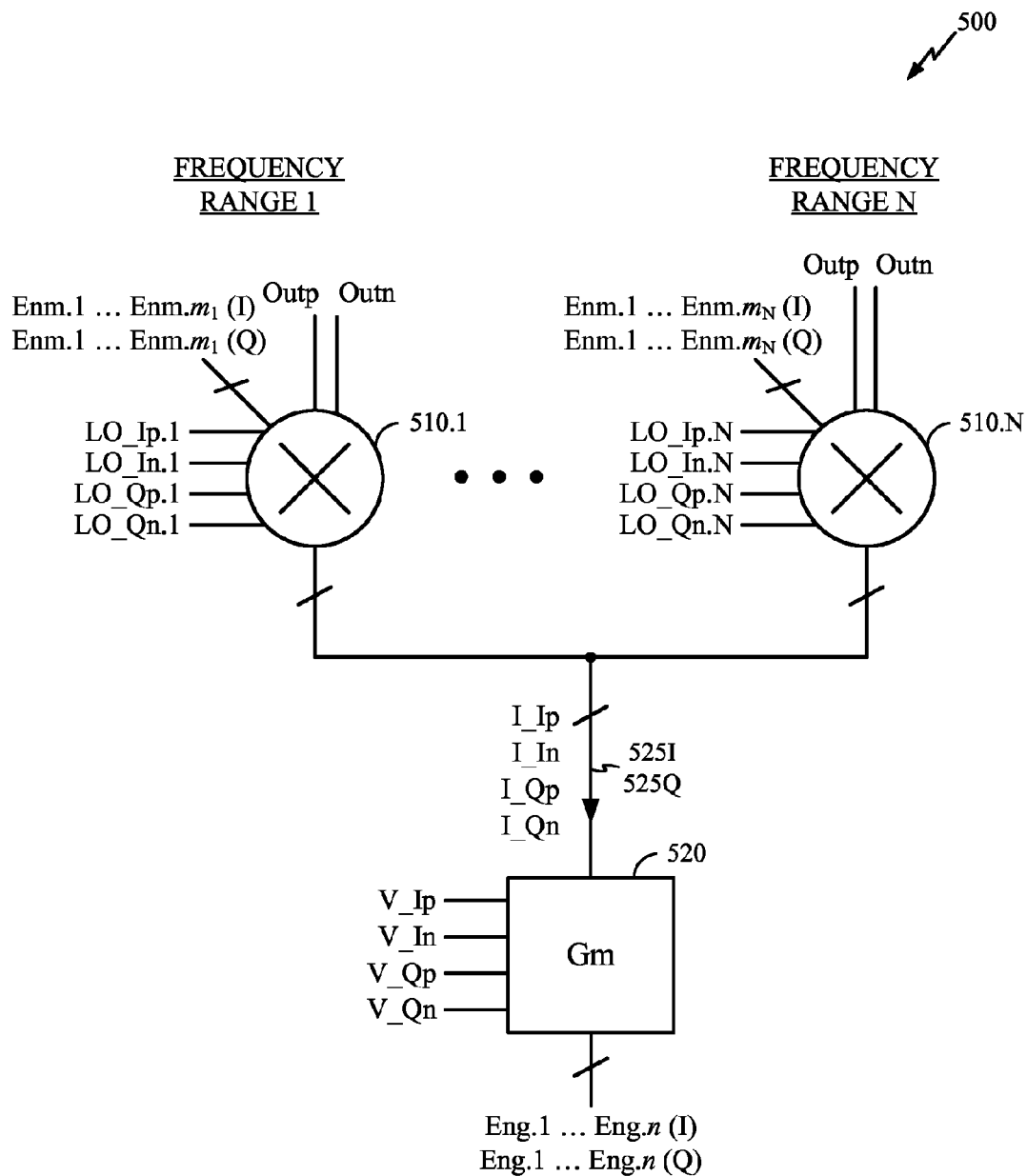
FIG. 5 illustrates an alternative exemplary embodiment of the present disclosure, wherein a single Gm block is shared amongst multiple mixers for N distinct frequency ranges.

FIG. 5 illustrates an alternative exemplary embodiment 500 of the present disclosure, wherein a single Gm block 520 is shared amongst multiple mixer blocks 510.1 through 510.N for N distinct frequency ranges. In FIG. 5, a first mixer block 510.1 is provided for a first frequency range 1, a second mixer block (not shown) is provided for a second frequency range, and so forth, up to an N-th mixer block 510.N provided for an N-th frequency range N. Enable signals Enm.1 through Enm.$m_1$(I) and Enm.1 through Enm.$m_N$(Q) are provided for the mixer unit cells (not shown) in each of the mixer blocks 510.1 through 510.N, respectively. Note the values of the control bits, as well as the number of control bits m, for a mixer block of one frequency range may generally be independent of those for a mixer block of another frequency range. All of the mixer blocks 510.1 through 510.N may share the conductive paths 525I, 525Q from a single Gm block 520. It may be appreciated that this scheme reduces the die area required for multiple frequency ranges, as compared to an implementation wherein distinct mixer and Gm blocks are provided for each frequency range.

Similarly, in an alternative exemplary embodiment, multiple Gm blocks may also be provided for a single mixer unit cell. For example, in a receiver application, multiple front-end low-noise amplifiers (LNA's) may be provided, each LNA optimized for a different receive frequency range, and each LNA coupled to a separate Gm block. Such alternative exemplary embodiments are contemplated to be within the scope of the present disclosure.

It will be appreciated that according to the techniques of the present disclosure, the number of conductive leads routed between the mixer block and the Gm block may be reduced as compared to conventional architectures. Furthermore, an additional degree of freedom is introduced in separately enabling the unit cells of the mixer versus the Gm block. These techniques result in there being fewer leads to be routed, and therefore a wider metal having lower sheet resistance may be used for the leads, thereby reducing the routing resistance and increasing the linearity of the Gm block. And as described with reference to FIG. 5, a single Gm block may be shared amongst multiple signal paths, leading to significant die area savings. Furthermore, in a transmitter embodiment of the present disclosure, the techniques described hereinabove may advantageously minimize the number of baseband conductive leads that cross the LO signal leads in the mixer-transconductance block layout, thereby advantageously reducing the amount of LO coupling present in the system.

Figure 6:
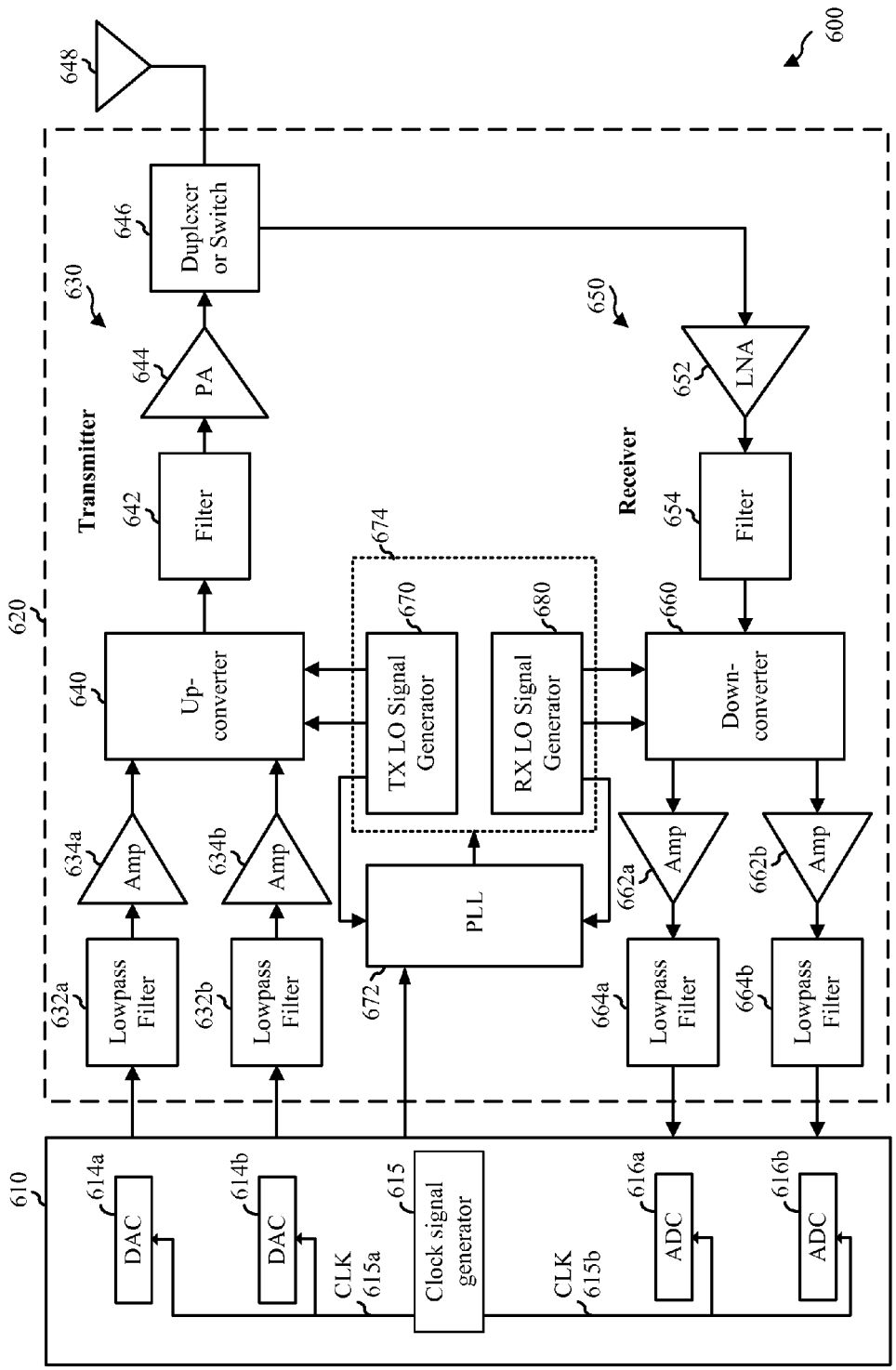
FIG. 6 illustrates a block diagram of a design of a wireless communication device in which the techniques of the present disclosure may be implemented.

FIG. 6 illustrates a block diagram of a design of a wireless communication device 600 in which the techniques of the present disclosure may be implemented. FIG. 6 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 6. Furthermore, other circuit blocks not shown in FIG. 6 may also be used to condition the signals in the transmitter and receiver. Some circuit blocks in FIG. 6 may also be omitted.

In the design shown in FIG. 6, wireless device 600 includes a transceiver 620 and a data processor 610. The data processor 610 may include a memory (not shown) to store data and program codes. Transceiver 620 includes a transmitter 630 and a receiver 650 that support bi-directional communication. In general, wireless device 600 may include any number of transmitters and any number of receivers for any number of communication systems and frequency ranges. All or a portion of transceiver 620 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 6, transmitter 630 and receiver 650 are implemented with the direct-conversion architecture.

In the transmit path, data processor 610 processes data to be transmitted and provides I and Q analog output signals to transmitter 630. In the exemplary embodiment shown, the data processor 610 includes digital-to-analog-converters (DAC's) 614a and 614b for converting digital signals generated by the data processor 610 into the I and Q analog output signals. The DAC's 614a and 614b may each be provided with a clock signal 615a generated by a clock signal generator 615.

Within transmitter 630, lowpass filters 632a and 632b filter the I and Q analog output signals, respectively, to remove undesired images caused by the prior digital-to-analog conversion. Amplifiers (Amp) 634a and 634b amplify the signals from lowpass filters 632a and 632b, respectively, and provide I and Q baseband signals. An upconverter 640 upconverts the I and Q baseband signals with I and Q transmit (TX) local oscillating (LO) signals from a TX LO signal generator 670 and provides an upconverted signal. A filter 642 filters the upconverted signal to remove undesired images caused by the frequency upconversion as well as noise in a receive frequency band. A power amplifier (PA) 644 amplifies the signal from filter 642 to obtain the desired output power level and provides a transmit RF signal. The transmit RF signal is routed through a duplexer or switch 646 and transmitted via an antenna 648.

In the receive path, antenna 648 receives signals transmitted by base stations and provides a received RF signal, which is routed through duplexer or switch 646 and provided to a low noise amplifier (LNA) 652. The received RF signal is amplified by LNA 652 and filtered by a filter 654 to obtain a desirable RF input signal. A downconverter 660 downconverts the RF input signal with I and Q receive (RX) LO signals from an RX LO signal generator 680 and provides I and Q baseband signals. The I and Q baseband signals are amplified by amplifiers 662a and 662b and further filtered by lowpass filters 664a and 664b to obtain I and Q analog input signals, which are provided to data processor 610. In the exemplary embodiment shown, the data processor 610 includes analog-to-digital-converters (ADC's) 616a and 616b for converting the analog input signals into digital signals to be further processed by the data processor 610. The ADC's 616a and 616b may each be provided with a clock signal 615b generated by the clock signal generator 615.

The LO signal generator 674 includes TX LO signal generator 670 and RX LO signal generator 680. TX LO signal generator 670 generates the I and Q TX LO signals used for frequency upconversion. RX LO signal generator 680 generates the I and Q RX LO signals used for frequency downconversion. Each LO signal is a periodic signal with a particular fundamental frequency. A PLL 672 receives timing information from data processor 610 and generates a signal used to adjust the frequency and/or phase of the RX and TX LO signals generated by 670 and 680.

In an exemplary embodiment, the upconverter 640 and/or the downconverter 660 may each include a mixer block and a transconductance (Gm) block, and adopt the techniques described herein for efficiently interfacing the mixer and Gm blocks.

Figure 7:
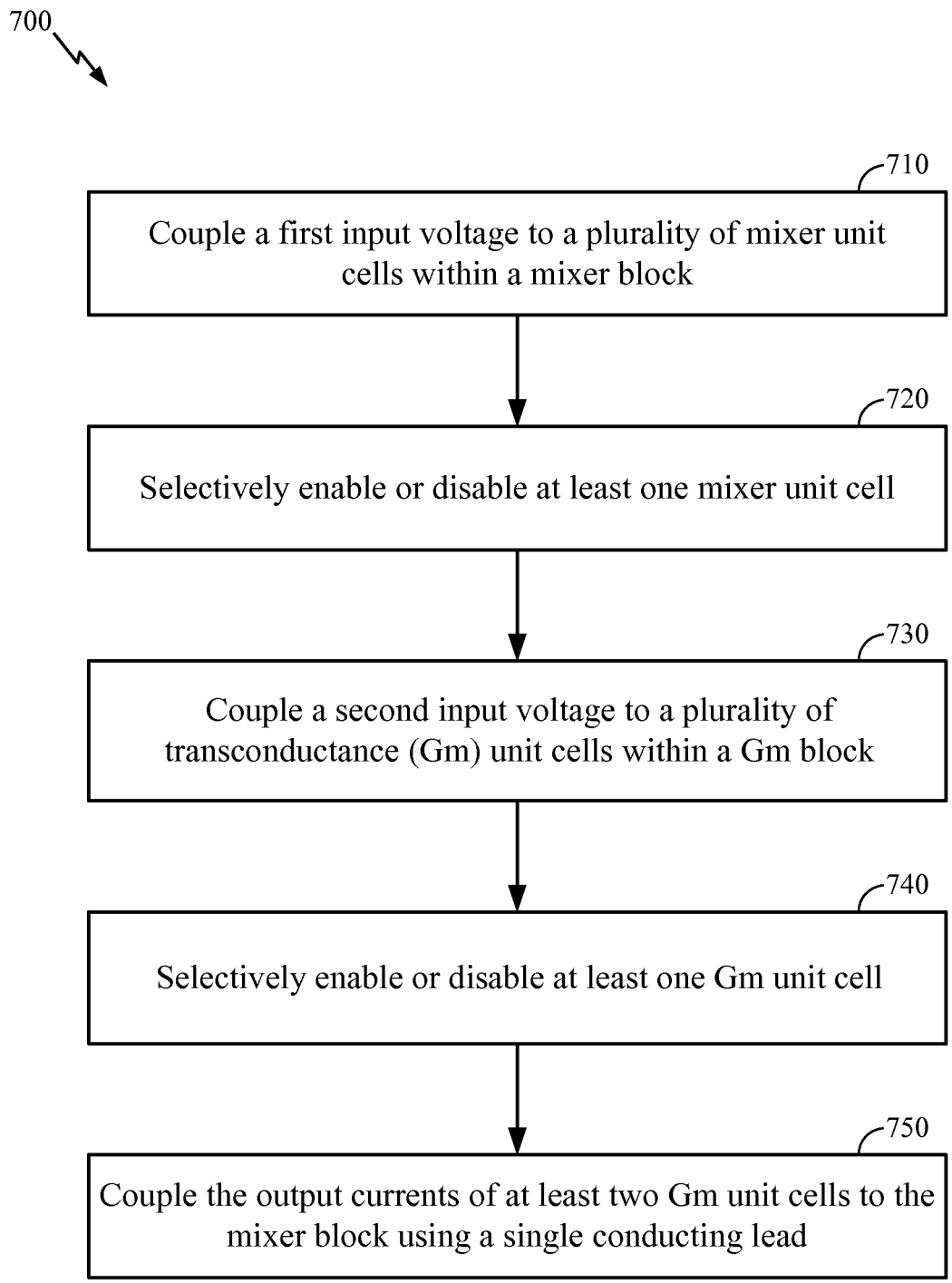
FIG. 7 illustrates an exemplary embodiment of a method according to the present disclosure.

FIG. 7 illustrates an exemplary embodiment of a method 700 according to the present disclosure. The method 700 is shown for illustrative purposes only, and is not meant to limit the scope of the present disclosure to any particular methods described.

In FIG. 7, at block 710, a first input voltage is coupled to a plurality of mixer unit cells within a mixer block.

At block 720, at least one mixer unit cell is selectively enabled or disabled.

At block 730, a second input voltage is coupled to a plurality of transconductance (Gm) unit cells within a Gm block.

At block 740, at least one Gm unit cell is selectively enabled or disabled.

At block 750, the output currents of at least two Gm unit cells are coupled to the mixer block using a single conductive lead.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An apparatus comprising:
a mixer block having a first voltage input, the mixer block comprising a plurality of mixer unit cells, each mixer unit cell having a mixer unit voltage input and a mixer unit current input, wherein the first voltage input is coupled to the mixer unit voltage input of each mixer unit cell,
a transconductance (Gm) block having a second voltage input, the Gm block comprising a plurality of Gm unit cells sharing common drains, each Gm unit cell coupled to the second voltage input and comprising a plurality of transistors and configured to convert the second voltage input into a Gm unit cell current output, wherein a plurality of Gm unit current outputs are conductively coupled together; and
a conductive path coupling the conductively coupled plurality of Gm unit current outputs to the mixer unit current input of each mixer unit cell;
wherein the conductive path comprises a single conductive lead configured to carry a sum of the conductively coupled Gm unit current outputs to the mixer unit current inputs of each of the plurality of mixer unit cells.

2. The apparatus of claim 1, wherein:
at least one mixer unit cell is capable of being selectively enabled or disabled; and
each particular mixer unit cell is configured to generate an output signal proportional to a first voltage of the first voltage input mixed with a first current of the mixer unit current input of the particular mixer unit cell.

3. The apparatus of claim 2, wherein:
at least one Gm unit cell is capable of being selectively enabled or disabled based on a binary coding scheme;
each particular Gm unit cell is configured to generate a Gm unit output current of the particular Gm unit cell; and
the Gm unit output current of the particular Gm unit cell is proportional to a second voltage of the second voltage input.

4. The apparatus of claim 1, each of the mixer unit cells comprising a differential pair, the first voltage being a differential voltage comprising a positive voltage and a negative voltage, wherein the first voltage input comprises a positive voltage input and a negative voltage input.

5. The apparatus of claim 1, wherein the second voltage is a differential voltage comprising a positive voltage and a negative voltage, the conductive path comprising a positive conductive path and a negative conductive path, each Gm unit cell configured to generate a positive Gm output current of a positive Gm current output of the particular Gm unit cell, wherein the positive Gm output current is proportional to the positive voltage and each Gm unit cell is configured to generate a negative Gm output current of a negative Gm current output of the particular Gm unit cell, wherein the negative Gm output current is proportional to the negative voltage, the positive Gm current outputs of the plurality of Gm unit cells are conductively coupled together by the positive conductive path, and the negative Gm current outputs of the plurality of Gm unit cells are conductively coupled together by the negative conductive path.

6. The apparatus of claim 1, wherein the first voltage includes an in-phase local oscillator (LO) voltage and wherein the second voltage includes a received signal voltage.

7. The apparatus of claim 1, wherein the first voltage includes an in-phase local oscillator (LO) voltage and wherein the second voltage includes a signal voltage to be transmitted.

8. The apparatus of claim 1, wherein:
the mixer block further includes a first auxiliary voltage input, the mixer block further comprising a plurality of auxiliary mixer unit cells, each auxiliary mixer unit cell coupled to the first auxiliary voltage input, each auxiliary mixer unit cell having an auxiliary mixer unit current input, at least one auxiliary mixer unit cell capable of being selectively enabled or disabled, each particular auxiliary mixer unit cell configured to generate an output signal proportional to a first auxiliary voltage of the first auxiliary voltage input mixed with a first auxiliary current of the auxiliary mixer unit current input of the particular auxiliary mixer unit cell;
the Gm block further includes a second auxiliary voltage input, the Gm block further comprising a plurality of auxiliary Gm unit cells, each auxiliary Gm unit cell coupled to the second auxiliary voltage input, at least one auxiliary Gm unit cell capable of being selectively enabled or disabled, each particular auxiliary Gm unit cell configured to generate an auxiliary Gm unit output current of an auxiliary Gm unit current output of the particular auxiliary Gm unit cell, wherein the auxiliary Gm unit output current is proportional to a second auxiliary voltage of the second auxiliary voltage input, and wherein corresponding auxiliary Gm unit current outputs of the plurality of auxiliary Gm unit cells are conductively coupled together; and
the apparatus further comprises an auxiliary conductive path coupling the conductively coupled corresponding auxiliary Gm unit current outputs to the auxiliary mixer unit current inputs.

9. The apparatus of claim 8, the first voltage comprising an in-phase local oscillator (LO) voltage, the first auxiliary voltage comprising a quadrature LO voltage, the second voltage comprising an in-phase signal voltage, and the second auxiliary voltage comprising a quadrature signal voltage.

10. The apparatus of claim 1, further comprising a second mixer block having a second voltage input, the second mixer block comprising:

a plurality of second mixer unit cells, each second mixer unit cell coupled to the second voltage input of the second mixer block, each second mixer unit cell having a second mixer unit current input, at least one second mixer unit cell capable of being selectively enabled or disabled, each particular second mixer unit cell configured to generate an output current proportional to a second voltage of the second voltage input of the second mixer block mixed with a second current of the second mixer unit current input of the particular second mixer unit cell, wherein the conductive path further couples the conductively coupled corresponding Gm unit current outputs to the second mixer unit input currents.

11. The apparatus of claim 10, the first voltage of the first voltage input of the mixer block comprising a signal voltage for a first frequency band, the second voltage of the second voltage input of the second mixer block comprising a signal voltage for a second frequency band.

12. The apparatus of claim 1, the plurality of mixer unit cells having equal size.

13. The apparatus of claim 1, a first mixer unit cell having a size two times the size of a second mixer unit cell.

14. The apparatus of claim 1, the plurality of Gm unit cells having equal size.

15. The apparatus of claim 1, a first Gm unit cell having a size two times the size of a second Gm unit cell.

16. The apparatus of claim 1, each Gm unit cell comprising a Gm transistor configured to generate the Gm unit output current of the particular Gm unit cell proportional to the second voltage of the second voltage input.

17. A method comprising:
providing a first input voltage to a plurality of mixer unit cells within a mixer block;
providing a second input voltage to a plurality of transconductance (Gm) unit cells sharing common drains within a Gm block, wherein each Gm unit cell comprises a plurality of transistors configured to convert the second voltage input into a Gm unit output current; and
providing output currents of at least two Gm unit cells to each mixer unit cell of the plurality of mixer unit cells using a single conductive path;
wherein the single conductive path is configured to carry a sum of output currents of the at least two Gm unit cells to mixer unit current inputs of each of the plurality of mixer unit cells.

18. The method of claim 17, further comprising selectively enabling or disabling at least one mixer unit cell.

19. The method of claim 18, further comprising selectively enabling or disabling at least one Gm unit cell based on a binary coding scheme.

20. The method of claim 17, each of the mixer unit cells comprising a differential pair, the first voltage input comprising a differential voltage input.

21. The method of claim 17, the second voltage input comprising a differential voltage input.

22. The method of claim 17, further comprising:
providing a first auxiliary input to a plurality of auxiliary mixer unit cells within the mixer block;
selectively enabling or disabling at least one auxiliary mixer unit cell;
providing a second auxiliary input to a plurality of auxiliary Gm unit cells within the Gm block;
selectively enabling or disabling at least one auxiliary Gm unit cell; and
providing output currents of at least two auxiliary Gm unit cells to the plurality of auxiliary mixer unit cells using a single auxiliary conductive path.

23. The method of claim 17, further comprising:
providing a secondary input voltage to a plurality of secondary mixer unit cells within a secondary mixer block;
selectively enabling or disabling at least one secondary mixer unit cell;
providing output currents of at least two auxiliary Gm unit cells to the plurality of secondary mixer unit cells using the single auxiliary conductive path.

24. A device for wireless communications, comprising:
a mixer block having a first voltage input, the mixer block comprising a plurality of mixer unit cells, each mixer unit cell having a mixer unit voltage input and a mixer unit current input, wherein the first voltage input is coupled to the mixer unit voltage input of each mixer unit cell;
a transconductance (Gm) block having a second voltage input, the Gm block comprising a plurality of Gm unit cells sharing common drains, each Gm unit cell coupled to the second voltage input, comprising a plurality of transistors, and configured to convert the second voltage input into a Gm unit output current, wherein corresponding Gm unit current outputs of the plurality of Gm unit cells are conductively coupled together; and
a conductive path comprising a single conductive lead coupling the conductively coupled corresponding Gm unit current outputs to the mixer unit current input of each mixer unit cell, the single conductive lead configured to transmit a sum of all Gm unit current outputs to each of the mixer unit current inputs of the plurality of mixer unit cells.

25. The device of claim 24, wherein the device further comprises:
at least one baseband transmit (TX) amplifier for amplifying a TX signal,
a TX LO signal generator,
an upconverter coupled to the TX LO signal generator and the output of the at least one baseband TX amplifier,
a TX filter coupled to the output of the upconverter, a power amplifier (PA) coupled to the TX filter,
an RX filter, a low-noise amplifier (LNA) coupled to the RX filter,
an RX LO signal generator,
a downconverter coupled to the RX LO signal generator and the RX filter, and
at least one low-pass filter coupled to the output of the downconverter.

26. The device of claim 25, the TX LO signal generator comprising in-phase and quadrature TX LO differential leads, the output of the TX amplifier comprising in-phase and quadrature TX differential leads, the upconverter comprising the mixer block, the Gm block, and the conductive path, the first voltage input coupled to the in-phase and quadrature TX LO differential leads, the second voltage input coupled to the in-phase and quadrature TX differential leads.

27. The device of claim 25, the RX LO signal generator comprising in-phase and quadrature RX LO differential leads, the downconverter comprising the mixer block, the Gm block, and the conductive path, the first voltage input coupled to the in-phase and quadrature RX LO differential leads, the second voltage input coupled to the output of the LNA.

28. A non-transitory computer-readable medium storing a computer program, wherein execution of the computer program is for:
providing a first input voltage to a plurality of mixer unit cells within a mixer block;
providing a second input voltage to a plurality of transconductance (Gm) unit cells sharing common drains within a Gm block, wherein each Gm unit cell comprises a plurality of transistors and is configured to convert the second voltage input into a Gm unit output current; and
providing output currents of at least two Gm unit cells to each mixer unit cell of the plurality of mixer unit cells using a single conductive path;
wherein the single conductive path is configured to carry a sum of output currents of the at least two Gm unit cells to mixer unit current inputs of each of the plurality of mixer unit cells.

29. An apparatus comprising:
means for providing a first input voltage to a plurality of mixer unit cells within a mixer block;
means for providing a second input voltage to a plurality of transconductance (Gm) unit cells sharing common drains within a Gm block, wherein each Gm unit cell comprises a plurality of transistors and is configured to convert the second voltage input into a Gm unit output current; and
means for providing output currents of at least two Gm unit cells of the plurality of Gm unit cells to each mixer unit cell of the plurality of mixer unit cells using a single conductive path;
wherein the single conductive path is configured to carry a sum of output currents of the at least two Gm unit cells to mixer unit current inputs of each of the plurality of mixer unit cells.

\* \* \* \* \*